United States Patent
Gerber (10) Patent No.: US 9,899,105 B2
(45) Date of Patent: Feb. 20, 2018

(54) SYSTEMS AND METHODS FOR LOW VOLTAGE SECURE DIGITAL (SD) INTERFACES

(71) Applicant: QUALCOMM Incorporated, San Diego, CA (US)

(72) Inventor: Nir Gerber, Haifa (IL)

(73) Assignee: QUALCOMM Incorporated, San Diego, CA (US)

( * ) Notice: Subject to any disclaimer, the term of this patent is extended or adjusted under 35 U.S.C. 154(b) by 687 days.

(21) Appl. No.: 14/087,047

(22) Filed: Nov. 22, 2013

(65) Prior Publication Data

US 2015/0149841 A1 May 28, 2015

(51) Int. Cl.
- G11C 29/50 (2006.01)
- G06F 13/28 (2006.01)
- G06F 13/40 (2006.01)

(52) U.S. Cl.
CPC ........ *G11C 29/50004* (2013.01); *G06F 13/28* (2013.01); *G06F 13/4068* (2013.01); *Y02B 60/1228* (2013.01); *Y02B 60/1235* (2013.01)

(58) Field of Classification Search
CPC ............... G11C 29/50004; G06F 13/28; G06F 13/4068; Y02B 60/1228; Y02B 60/1235
See application file for complete search history.

(56) References Cited

U.S. PATENT DOCUMENTS

| | | | |
|---|---|---|---|
| 6,944,028 B1 | 9/2005 | Yu et al. | |
| 7,587,544 B2 | 9/2009 | Tang et al. | |
| 7,624,216 B2 | 11/2009 | Yoshikawa et al. | |
| 2003/0221066 A1 | 11/2003 | Kaneko | |
| 2007/0147157 A1* | 6/2007 | Luo | G11C 5/143 365/226 |

(Continued)

FOREIGN PATENT DOCUMENTS

CN 201134901 Y 10/2008

OTHER PUBLICATIONS

SD Group Technical Committee, "SD Specifications Part 1 Physical Layer Simplified Specification," Version 4.10, Jan. 22, 2013, SD Group, retrieved from https://www.sdcard.org/downloads/pls/simplified_specs1part1_410.pdf, 202 pages.*

(Continued)

*Primary Examiner* — Eric Oberly
(74) *Attorney, Agent, or Firm* — Withrow & Terranova, PLLC (57) ABSTRACT

Systems and methods for low voltage secure digital (SD) interfaces are disclosed. Embodiments of the present disclosure relate to systems and voltage for a lower voltage SD or SD Input/Output (SDIO) interface such as two integrated circuits. In particular, a SD or SDIO interface may be established between two SD compliant devices. While the SD compliant devices may otherwise comply with the SD standard, the voltage levels for signals passed between the SD compliant devices may be below 1.8 volts that the standard mandates. This reduced voltage is possible because the distances involved for interchip communication or the short distances involved for mobile terminal to peripheral connection are short enough that the reduced voltage is sufficient to still provide the desired signal strength at the receiver.

23 Claims, 5 Drawing Sheets

(56) References Cited

U.S. PATENT DOCUMENTS

| | | | | |
|---|---|---|---|---|
| 2010/0138580 A1* | 6/2010 | Asfur | .................... | G06F 13/385 |
| | | | | 710/301 |
| 2010/0322007 A1* | 12/2010 | Jeon | ....................... | G11C 16/20 |
| | | | | 365/185.18 |
| 2014/0258796 A1* | 9/2014 | Ghaly | ................ | G01R 31/3171 |
| | | | | 714/708 |

OTHER PUBLICATIONS

Logic Level [online]. Wikipedia [retrieved on Jun. 21, 2016]. Retrieved from the Internet: <URL: https://en.wikipedia.org/wiki/Logic_level.*

Kuphaldt, Tony R., Lessons in Electric Circuits, vol. 4 [Digital Book], Nov. 1, 2007, p. 90-99 [online], [retrieved on Nov. 18, 2016]. Retrieved from the Internet <URL:https://www.ibiblio.org/kuphaldt/electricCircuits/Digital/DIGI.pdf>.*

SD Group Technical Committee, "SD Specifications Part 1 Physical Layer Simplified Specification," Version 4.10, Jan. 22, 2013, SD Group, retrieved from https://www.sdcard.org/downloads/pls/simplified_specs/part1_410.pdf, 202 pages.

International Search Report and Written Opinion for PCT/US2014/066567, dated Mar. 23, 2015, 9 pages.

Second Written Opinion for PCT/US2014/066567, dated Nov. 4, 2015, 4 pages.

International Preliminary Report on Patentability for PCT/US2014/066567, dated Feb. 15, 2016, 15 pages.

\* cited by examiner

SYSTEMS AND METHODS FOR LOW VOLTAGE SECURE DIGITAL (SD) INTERFACES

BACKGROUND

I. Field of the Disclosure

The technology of the disclosure relates generally to a secure digital (SD) interface.

II. Background

Mobile communication devices have become common in current society. The prevalence of these mobile devices is driven in part by the many functions that are now enabled on such devices. Demand for such functions increases processing capability requirements and generates a need for more powerful batteries. Within the limited space of the housing of the mobile communication device, batteries compete with the processing circuitry. The competition for space between the components that provide the increased functionality and the battery that powers those components contributes to continued pressure to minimize power consumption so as to maximize available battery power.

One of many sources of inadvertent power consumption lies in the conductors that connect power consuming components to the power source. That is, such conductors have a resistance inherently present, and this resistance consumes power. One technique to reduce such inadvertent power consumption is to shorten the distance between the power source and the power consuming element.

Conductive path length is generally within the control of the product designer for conductors within the product. However, many products are now capable of being connected to peripherals. For example, smart phones may be connected to external speakers, external monitors, external keyboards, or the like. Desktop computers may be connected to smart phones, speakers, remote memory devices, or the like. In many cases, power may be transferred between the host and the peripheral device. The product designer rarely has control over the length of the cable that is used to connect the host to the peripheral. Because many such cables are approximately a meter (or more) long, the voltage levels for signals on such cables are typically several volts. In many cases, a standards body (e.g., Joint Electron Device and Engineering Council (JEDEC), USB-IF, Inc., SD Card Association) publishes a standard which sets forth minimum voltage levels for such connectors and/or cables. When applied to a mobile device such as a smart phone, the required voltage levels create large demands on the batteries of the mobile device. Additionally, higher level voltages may increase electromagnetic interference (EMI).

SUMMARY OF THE DISCLOSURE

Embodiments of the present disclosure relate to systems and methods for low voltage secure digital (SD) interfaces. The SD and SD Input/Output (SDIO) standards are published by the SD Card Association, which specifies that the minimum voltage level to achieve a logical one (or logical high) on SD and SDIO compliant cables is 1.8 Volts (V) in this example. In exemplary embodiments of the present disclosure, an SD (or SDIO) interface may be established between two SD compliant devices, such as two integrated circuits (ICs). While the SD compliant devices may otherwise comply with the SD standard, the voltage levels for signals passed between the SD compliant devices may be below 1.8 volts that the standard mandates. This reduced voltage is possible, because the distances involved for interchip communication or the short distances involved for mobile terminal to peripheral connection are short enough that the reduced voltage is sufficient to still provide the desired signal strength at the receiver. The reduced voltages increase battery life and may reduce electromagnetic interference (EMI). Additionally, by using lower level voltages that are common in the SD compliant device, there may be a reduced number of power rails, because designers may be able to share existing voltage sources (e.g., Vdd). In some cases as another example, the reduced power level may reduce the need for an external level shifter.

In this regard in one embodiment, a method of interconnecting two SD compliant devices comprises coupling a transmitting output of a first SD device of the two devices to a receiving input of a second SD device. The method also includes operating according to the SD standard except that voltage levels at the transmitting output are less than 1.8 volts.

In another embodiment, a method of interconnecting two SD compliant devices comprises coupling a transmitting output of a first SD device of the two devices to a receiving input of a second SD device. The method also includes initially transmitting an otherwise SD compliant signal to the second SD device at a first signal level below 1.8 volts. The method also includes determining if there is a response from the second SD device. The method also includes incrementing to a second signal level at or above 1.8 volts for transmission of the signal.

In another embodiment, a host is configured to operate using a SD standard with a remote device, the host comprising a transmitter configured to transmit a transmitted signal to the remote device. The method also includes a receiver configured to receive a received signal from the remote device, wherein the transmitted signal complies with the SD standard except that transmitted voltage levels are less than 1.8 volts.

In another embodiment, a method of interconnecting two SD compliant devices comprises coupling a transmitting output of a first SD compliant device of the two devices to a receiving input of a second SD compliant device. The method also includes initially transmitting an otherwise SD compliant signal to the second SD compliant device at a first signal level. The method also comprises receiving a reply from the second SD compliant device with a capability parameter. The method also includes subsequently transmitting signals to the second SD compliant device at a voltage level based on the capability parameter.

In another embodiment a method of interconnecting two SD compliant devices comprises coupling a transmitting output of a first SD compliant device of the two devices to a receiving input of a second SD compliant device. The method also includes initially transmitting an otherwise SD compliant signal to the second SD compliant device at a first signal level. The method also comprises subsequently transmitting signals to the second SD compliant device. The method also includes determining a bit error rate for signals transmitted to and received from the second SD compliant device. The method also includes adjusting a voltage level for transmitted signals based on the bit error rate.

DETAILED DESCRIPTION

With reference now to the drawing figures, several exemplary embodiments of the present disclosure are described. The word "exemplary" is used herein to mean "serving as an example, instance, or illustration." Any embodiment described herein as "exemplary" is not necessarily to be construed as preferred or advantageous over other embodiments.

Embodiments of the present disclosure relate to systems and methods for low voltage secure digital (SD) interfaces. The SD and SD Input/Output (SDIO) standards are published by the SD Card Association, which specifies that the minimum voltage level to achieve a logical one (or logical high) on SD and SDIO compliant cables is 1.8 Volts (V) in this example. In exemplary embodiments of the present disclosure, an SD (or SDIO) interface may be established between two SD compliant devices, such as two integrated circuits (ICs). While the SD compliant devices may otherwise comply with the SD standard, the voltage levels for signals passed between the SD compliant devices may be below 1.8 volts that the standard mandates. This reduced voltage is possible, because the distances involved for interchip communication or the short distances involved for mobile terminal to peripheral connection are short enough that the reduced voltage is sufficient to still provide the desired signal strength at the receiver. The reduced voltages increase battery life and may reduce electromagnetic interference (EMI). Additionally, by using lower level voltages that are common in the SD compliant device, there may be a reduced number of power rails, because designers may be able to share existing voltage sources (e.g., Vdd). In some cases as another example, the reduced power level may reduce the need for an external level shifter.

In this regard, exemplary embodiments of the present disclosure are directed to host and device elements that are generally designed to comply with the SD standard and/or the SDIO standard. While normally such SD host and device elements are formed from a mobile terminal and a memory card, the SDIO host and device elements may be mobile terminals that use the SD slot to support GPS receivers, modems, barcode readers, FM radio tuners, TV tuners, radio frequency identification (RFID) readers, digital cameras, and interfaces to Wi-Fi, Bluetooth, Ethernet, Infrared Data Association (IrDA) signals and the like. The present disclosure advances a modified SD and SDIO communication format for signals passed between otherwise SD or SDIO compliant devices that uses a voltage signal that is lower than the minimum voltage signal set forth in these standards. By lowering the voltage signal, battery life is extended, EMI is reduced, and additional savings may be made through conservation of power rails. Overviews of exemplary host and device elements are presented in FIGS. 1 and 2, and exemplary processes are set forth with respect to FIGS. 3 and 4.

Figure 1:
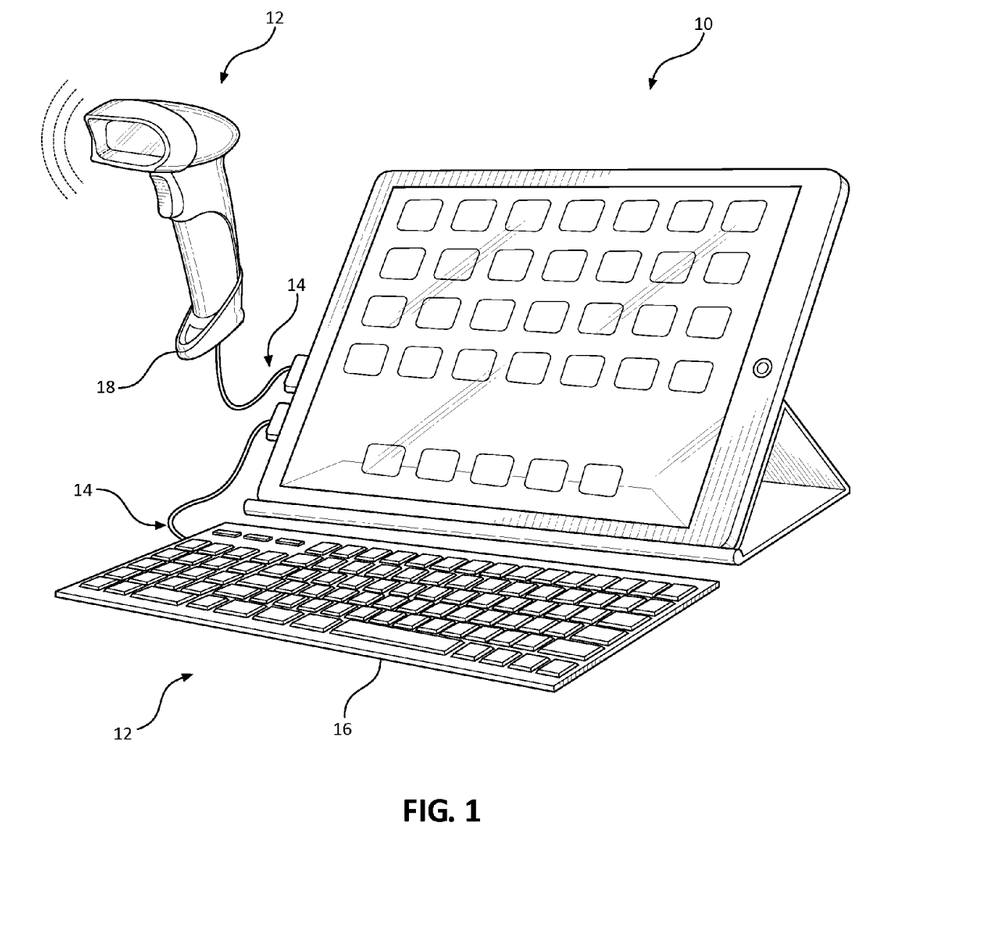
FIG. 1 is a simplified illustration of an exemplary computing device that may incorporate modified secure digital (SD) protocols in communicating with peripheral elements.

In this regard, FIG. 1 illustrates a mobile terminal 10, which in an exemplary embodiment is a tablet device. However, other mobile terminals such as cellular phones, smart phones, or the like, are also within the scope of "mobile terminal" as that term is used herein. The mobile terminal 10 is a generally SD (or SDIO) compliant element, and the mobile terminal 10 is a host as defined by the SD protocol and may include one or more peripheral elements 12 connected to the mobile terminal 10 by cables 14. In an exemplary embodiment, one peripheral component 12 may be a keyboard 16 and a second peripheral component 12 may be a barcode reader 18. The peripheral elements 12 are devices as defined by the SD protocol. Further, as used herein such peripheral element 12 is also defined to include an actual SD memory card. That is, while not illustrated, the mobile terminal 10 may have a slot or receptacle into which an SD memory card is inserted and it may operate according to exemplary low power usage embodiments of the present disclosure. While it is contemplated that the host and device communicate with a modified SD protocol as explained herein, it is possible that other SD type protocols, such as the SDIO protocol are used.

Figure 2:
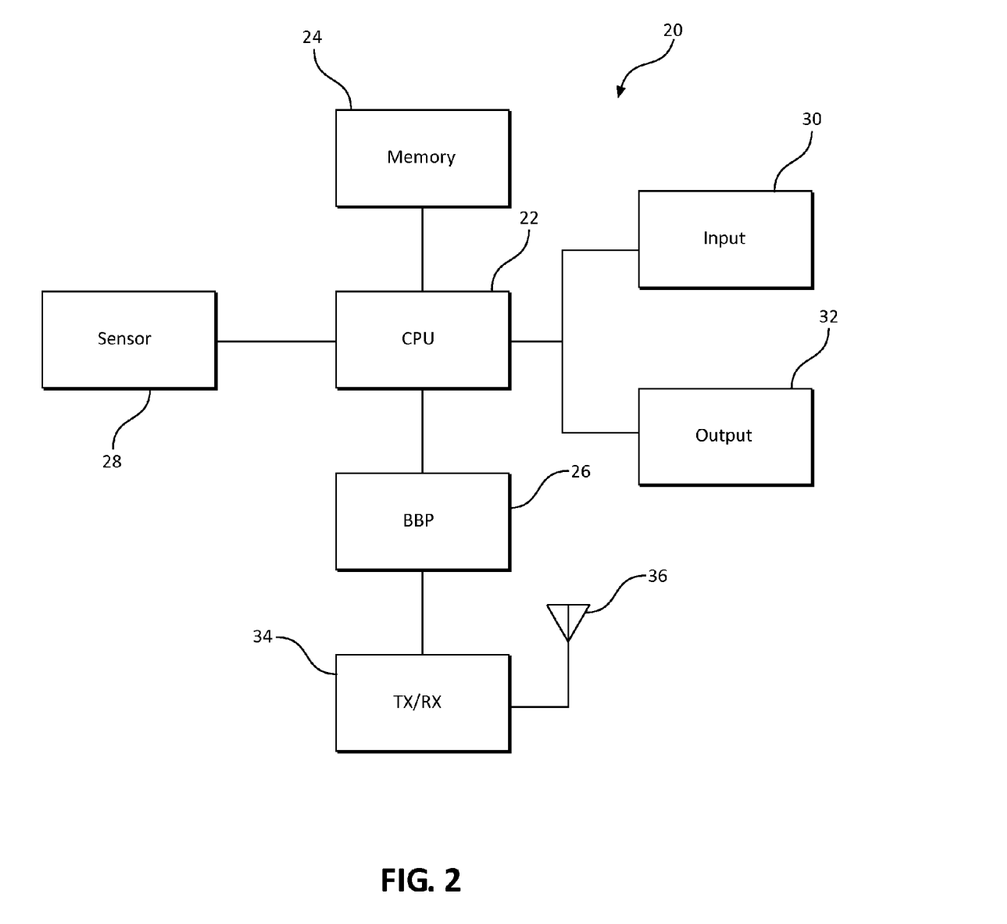
FIG. 2 is a block diagram of various components within a mobile terminal that may communicate with one another via the modified SD protocols of the present disclosure.

While the present disclosure is well suited for interdevice communication such as mobile terminal 10 to peripheral element 12 as illustrated in FIG. 1, the present disclosure is not so limited. In this regard, FIG. 2 illustrates a chip level system 20 where interchip communication may be performed according to the modified standards set forth herein. Such chip level system 20 may be within a mobile terminal such as mobile terminal 10 or within another computing device such as a desktop computer or the like. Chip level system 20 may include a central processing unit (CPU) 22 that communicates with a memory system 24, a baseband processor (BBP) 26, one or more sensors 28, input devices 30, and output devices 32. The BBP 26 may communicate with a transceiver 34, which in turn sends wireless signals through an antenna 36. One or more of the communication paths within the chip level system 20 may be made through the modified protocols of the present disclosure.

Given the systems in which the modified protocols of the present disclosure can operate, an explanation of the modified protocols is now provided. In particular, the present disclosure contemplates using the SD or SDIO protocols, but allowing for signals to be sent at voltage levels below those specified by the standards. Thus, while the SD and SDIO standards specify that the signals for a logical one (or logical high) should be 1.8 volts or higher, the present disclosure contemplates sending signals at voltages lower than 1.8 volts. The lower voltages are possible because the distances involved in most mobile terminal 10 to peripheral element 12 communications are substantially shorter than those originally contemplated by the SD and SDIO standards. Likewise, the distances involved in interchip communications such as those found in chip level system 20 are orders of magnitude smaller than the distances originally contemplated by the SD and SDIO standards. Thus, by lowering the voltage, the present disclosure can reduce power consumption and extend battery life. Likewise, lower voltages may allow for less EMI between components as another example. Still further, the ability to use lower voltages in signaling between SD compliant elements may allow for simplified design options within a chip level system 20 because the voltage rails of the various components may be reused and there is no need for voltage rails carrying the higher voltages of the traditional SD or SDIO standards. Thus, for example, chips, such as CPU 22 and BBP 26, may use a Vdd voltage rail instead of a higher level voltage rail. Still further, the reduced power level may eliminate the need for a level shifter as another example. That is, signals between chips that would otherwise be sent at voltage levels of 1.8 V or higher to comply with the SD standard are now sent at lower voltage levels and no longer have to be stepped down or buffered to provide signals at traditional complementary metal oxide semiconductor (CMOS) voltage levels.

The present disclosure provides two exemplary, non-limiting techniques through which a suitable logical high voltage level may be determined. These two techniques are explored with reference to FIGS. 3 and 4 described below.

Figure 3:
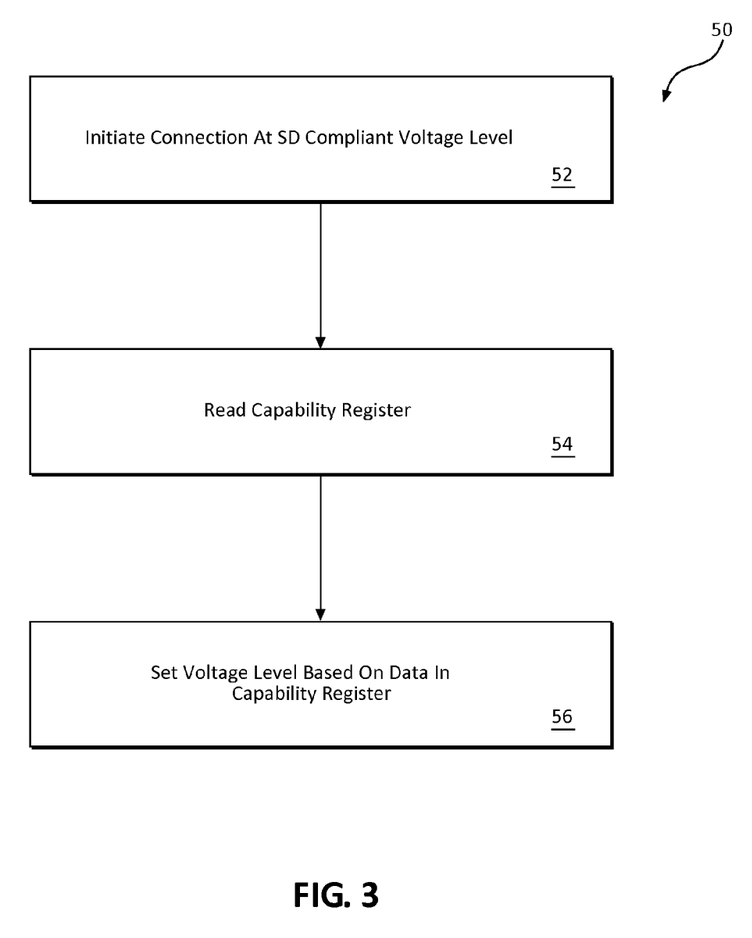
FIG. 3 is a flow chart for a static voltage level selection process for use with the modified SD protocols of the present disclosure.

In this regard, FIG. 3 provides a flow chart of an exemplary static voltage determination process 50. The process 50 starts when a connection is initiated between two SD (or SDIO) compliant devices (e.g., mobile terminal 10 and peripheral element 12 or CPU 22 and BBP 26) (block 52). The host initially transmits a query to the device using a normal voltage level and reads the capability register of the device (block 54). The capability register may have bits stored therein that tell the host what voltage level is required by the device. Based on the bits retrieved from the capability register, the host sets the voltage level (block 56). Alternatively, in another exemplary embodiment, the voltage level may be inferred or pre-defined by software according to device capabilities, distance (if known) to the peripheral, and/or required performance or a required frequency. In another exemplary embodiment, a voltage level may be defined according to circuit simulations. That is, if a known peripheral is connected to a known host at a known distance and a known frequency, then circuit simulations may be run before connection to ascertain what an appropriate voltage level would be. That voltage level may then be programmed into software for use when the connection is made.

By way of further explanation, the SD standard sets the bits in the capability register as summarized in Table 1. In particular, the bits may specifically indicate the voltage levels.

TABLE 1

| Summary of Capability Register settings | |
|---|---|
| 111 b | 3.3 V |
| 110 b | 3.0 V |
| 101 b | 1.8 V |
| 100 b-000 b | reserved |

Thus, bits 100*b*-000*b* may be redefined to provide a desired voltage level below 1.8 V.

Figure 4:
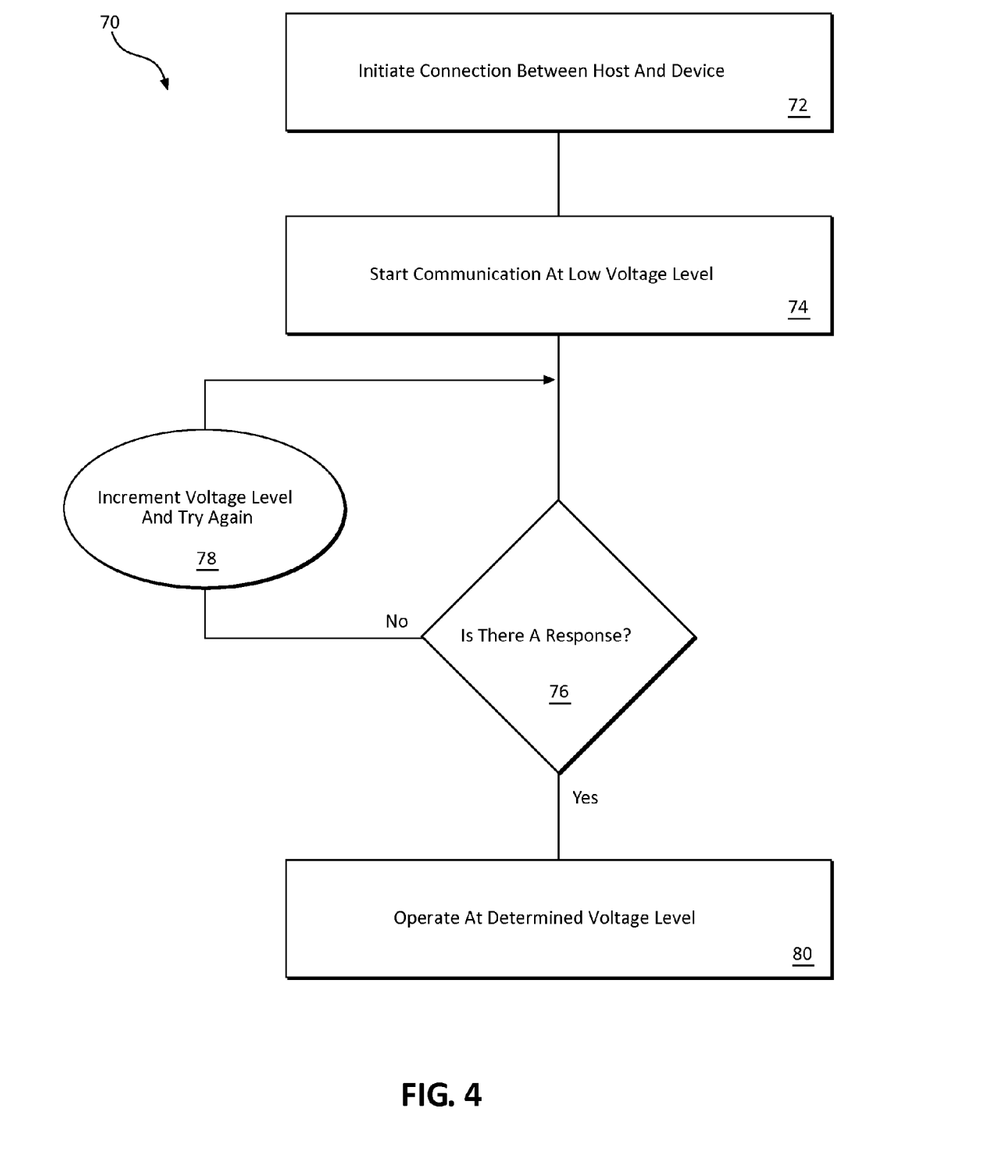
FIG. 4 is a flow chart for a dynamic voltage level selection process for use with the modified SD protocols of the present disclosure.

In a second exemplary technique to determine a suitable logical high voltage level, a SD compliant host detects a new device coupled to the host (e.g., the mobile terminal 10 detects the barcode reader 18 coupled by cable 14). The host then tests low voltage levels to see if the device can operate at voltages below 1.8 volts. If the device responds to the initial signal from the host, then communication proceeds at the low voltage levels. If the device does not respond within a predetermined amount of time, then the signal is resent with higher voltage levels until a response is received. In this regard, FIG. 4 illustrates a dynamic voltage determination process 70. The process begins when a connection is initiated between a host and a device (e.g., mobile terminal 10 and peripheral element 12 or CPU 22 and BBP 26) (block 72). The host initiates communication at a low voltage (block 74). In an exemplary embodiment, the low voltage level is 0.5 volts. The host determines if there is a response from the device (block 76). If the answer is no, there was no response within a predetermined amount of time, the host increments the voltage level and sends the communication again (block 78). In an exemplary embodiment, the voltage increment is 0.1 volts. Once the device is able to receive the communication and generate a response (i.e., block 76 is answered affirmatively), the host and device operate at the determined level (block 80).

While the JEDEC standard voltages such as 1.5 and 1.2 volts are specifically contemplated as appropriate voltage levels for the processes of the present disclosure, lower voltages may also be used, such as around one volt, even though there is no specific standard using such voltages. Further, while the specific numbers of one volt, 1.2 volts, and 1.5 volts are contemplated because they reflect standard levels, it should be appreciated that these numbers may be approximate threshold voltages (e.g., by approximate, the present disclosure means plus or minus about five to ten percent (5-10%) of the nominal value). In another exemplary embodiment, in place of incrementing to 1.2 and 1.5 volts, other standard voltages such as one volt for SDR12, 1.5 volts for SDR50, and up to 1.8 volts for SDR104 may be used. In still another exemplary embodiment, the selection of the increments for the voltage may be done according to frequency operation or bus speed mode. That is, buses that operate at a certain frequency or certain speed may have designated voltage levels (e.g., 1.5 volts for SDR50) and the increments or levels used to determine appropriate voltage levels may correspond to such predefined values. Likewise, the signals may be differential signals if desired. As a further variation, if the conditions change such that a signal is no longer being received, the dynamic voltage determination process 70 (FIG. 4) can start again to see what is a viable voltage level (e.g., if noise from an external source is present, the voltage levels may be increased until such time as that noise is removed). Likewise, if the initially acceptable level is relatively high, the dynamic voltage determination process 70 may be repeated periodically to determine if conditions have improved to the point where lower voltage levels are viable.

Instead of using particular standards such as the JEDEC or SDR standards to set voltage levels, a chip core voltage (e.g., 1 volt) may be used as an appropriate voltage level. Using such chip core voltage allows for connection dies without pads or without having to step down voltage. This arrangement may also allow for use of a shared Vdd supply voltage and the interface operates according to the reference voltage.

In another exemplary embodiment, instead of stepping through voltages and determining if a response is received, an error indication such as a bit error rate may be evaluated (e.g., compared to an acceptable threshold value), and if the error indication exceeds permissible values, the voltage level for the signals may be increased. That is, if the error indication exceeds an acceptable threshold value, the control system infers that the voltage levels are too low, and increases the voltage level of the signals so that the likelihood of detection of the correct signal is increased.

In another exemplary embodiment, not illustrated, the initial communication can be at a relatively high voltage (i.e., SD compliant) and the subsequent communications decrement the voltage down until no response is received from the device. The last valid voltage may then be used as the signal level.

In another exemplary embodiment, a voltage may initially be selected (e.g., through the dynamic techniques described above) for a first operation or connection and saved to memory for use in subsequent operations or connections. Thus, subsequent operations do not have to go through the dynamic process to determine an acceptable voltage level. Note that if an error indication exceeds a predetermined threshold, then the voltage level for the subsequent operations or connections may be adjusted as needed or desired.

The systems and methods for low voltage SD interface according to embodiments disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 5:
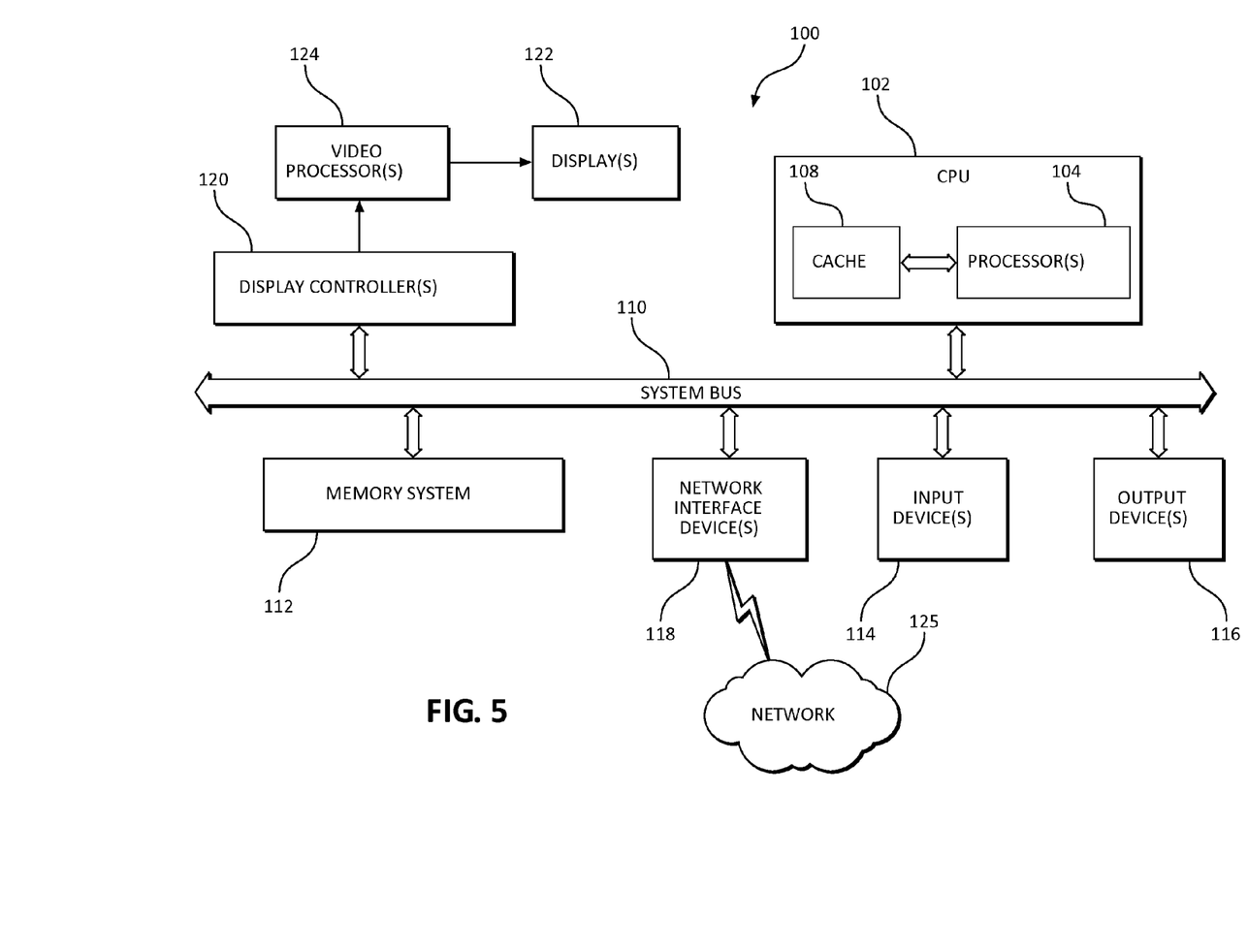
FIG. 5 is a block diagram of an exemplary processor-based system that can include the modified SD devices of FIGS. 1 and 2.

In this regard, FIG. 5 illustrates an example of a processor-based system 100 that can employ the modified SD or SDIO protocols illustrated in FIGS. 1-4. In this example, the processor-based system 100 includes one or more central processing units (CPUs) 102, each including one or more processors 104. The CPU(s) 102 may have cache memory 108 coupled to the processor(s) 104 for rapid access to temporarily stored data. The CPU(s) 102 is coupled to a system bus 110 and can intercouple master devices and slave devices included in the processor-based system 100. As is well known, the CPU(s) 102 communicates with these other devices by exchanging address, control, and data information over the system bus 110. For example, the CPU(s) 102 can communicate bus transaction requests to a memory system 112.

Other master and slave devices can be connected to the system bus 110. As illustrated in FIG. 5, these devices can include the memory system 112, one or more input devices 114, one or more output devices 116, one or more network interface devices 118, and one or more display controllers 120, as examples. The input device(s) 114 can include any type of input device, including but not limited to input keys, switches, voice processors, etc. The output device(s) 116 can include any type of output device, including but not limited to audio, video, other visual indicators, etc. The network interface device(s) 118 can be any devices configured to allow exchange of data to and from a network 126. The network 126 can be any type of network, including but not limited to a wired or wireless network, private or public network, a local area network (LAN), a wide local area network (WLAN), and the Internet. The network interface device(s) 118 can be configured to support any type of communication protocol desired.

The CPU(s) 102 may also be configured to access the display controller(s) 120 over the system bus 110 to control information sent to one or more displays 122. The display controller(s) 120 sends information to the display(s) 122 to be displayed via one or more video processors 124, which process the information to be displayed into a format suitable for the display(s) 122. The display(s) 122 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The arbiters, master devices, and slave devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The embodiments disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A method of interconnecting two secure digital (SD) compliant devices, comprising:
    coupling a transmitting output of a first SD compliant device of two SD compliant devices to a receiving input of a second SD compliant device; and
    operating according to an SD standard except that voltage levels at the transmitting output are less than 1.8 volts to achieve a logical high for signals.

2. The method of claim 1, wherein the two SD compliant devices comprise secure digital input/output (SDIO) compliant devices.

3. The method of claim 2, wherein the voltage levels comprise a peak of 1.2 volts or approximately 1.2 volts.

4. The method of claim 2, wherein the voltage levels comprise a peak of approximately 1.5 volts.

5. The method of claim 2, wherein coupling the transmitting output comprises coupling a differential output.

6. A method of interconnecting two secure digital (SD) compliant devices comprising:
    coupling a transmitting output of a first SD compliant device of two SD compliant devices to a receiving input of a second SD compliant device; and
    initially transmitting an otherwise SD compliant signal to the second SD compliant device at a first signal level below 1.8 volts representing a logical high;
    determining if there is a response from the second SD compliant device; and
    incrementing to a second signal level at or above 1.8 volts for transmission of the otherwise SD compliant signal.

7. The method of claim 6 wherein the two SD compliant devices comprise secure digital input/output (SDIO) compliant devices.

8. The method of claim 7, wherein determining if there is a response comprises waiting a predetermined amount of time for the response.

9. The method of claim 7, wherein initially transmitting the otherwise SD compliant signal to the second SD compliant device comprises transmitting a signal at a 1.2volt voltage level.

10. The method of claim 7, wherein initially transmitting the otherwise SD compliant signal to the second SD compliant device comprises transmitting a signal at a 1.5volt voltage level.

11. The method of claim 7, further comprising before incrementing to the second signal level above 1.8 volts incrementing to a third signal level above the first signal level but still below 1.8 volts.

12. The method of claim 11, wherein the third signal level is 1.5 volts.

13. The method of claim 7, wherein initially transmitting comprises transmitting a differential signal.

14. The method of claim 6, further comprising determining an error indication for signals transmitted to and received from the second SD compliant device.

15. The method of claim 14, wherein the error indication is a bit error rate.

16. The method of claim 14, further comprising adjusting a voltage level for transmitted signals based on the error indication.

17. A host configured to operate using a secure digital (SD) standard with a remote device, the host comprising:
    a transmitter configured to transmit a transmitted signal to a remote device; and
    a receiver configured to receive a received signal from the remote device;
    wherein the transmitted signal complies with an SD standard except that transmitted voltage levels for logical highs are less than 1.8 volts.

18. The host of claim 17, wherein the host and the remote device are SD input/output (SDIO) compliant devices.

19. The host of claim 18, wherein the received signal complies with the SD standard except that received voltage levels are less than 1.8 volts.

20. The host of claim 17, wherein the transmitted voltage levels are selected from the group consisting of 1.2 and 1.5 volts.

21. A method of interconnecting two secure digital (SD) compliant devices comprising:
    coupling a transmitting output of a first SD compliant device of two SD compliant devices to a receiving input of a second SD compliant device;
    initially transmitting an otherwise SD compliant signal to the second SD compliant device at a first signal level;
    receiving a reply from the second SD compliant device with a capability parameter relating to voltages for logical highs for signals; and
    subsequently transmitting signals to the second SD compliant device at a voltage level based on the capability parameter, where the voltage level for the logical highs are below 1.8 volts.

22. The method of claim 21, wherein the two SD compliant devices comprise SD input/output (SDIO) compliant devices.

23. A method of interconnecting two secure digital (SD) compliant devices comprising:
    coupling a transmitting output of a first SD compliant device of two SD compliant devices to a receiving input of a second SD compliant device; and
    initially transmitting an otherwise SD compliant signal to the second SD compliant device at a first signal level below 1.8 volts;
    subsequently transmitting signals to the second SD compliant device;
    determining an error indication for signals transmitted to and received from the second SD compliant device; and
    adjusting a voltage level for transmitted signals based on the error indication.

* * * * *